United States Patent [19]
Meyer, IV et al.

[11] Patent Number: 5,764,482
[45] Date of Patent: Jun. 9, 1998

[54] INTEGRATED CIRCUIT HEAT SEAT

[75] Inventors: George A. Meyer, IV, Conestoga; Jerome E. Toth, Hatboro; Mai-Loan Tran, Harrisburg; Attalee S. Taylor, Palmyra, all of Pa.

[73] Assignees: Thermacore, Inc., Lancaster, Pa.; Whitaker Corporation, Wilmington, Del.

[21] Appl. No.: 685,252

[22] Filed: Jul. 24, 1996

[51] Int. Cl.⁶ ............................................. H05K 7/20
[52] U.S. Cl. ........................ 361/699; 361/687; 361/689; 361/700; 361/704; 361/717; 361/718; 174/15.2; 174/16.3; 165/80.4; 257/713; 257/714; 257/715; 62/259.2
[58] Field of Search ............................. 361/687, 699, 361/700, 703, 704, 705, 707, 717, 718, 719, 720; 165/80.3, 104.33, 185; 62/259.2; 174/15.2, 16.3; 257/712, 713, 714, 715; 364/708.1

[56] References Cited

U.S. PATENT DOCUMENTS

| | | | |
|---|---|---|---|
| 4,345,267 | 8/1982 | Corman et al. | 257/719 |
| 4,658,331 | 4/1987 | Berg | 361/705 |
| 5,095,404 | 3/1992 | Chao | 361/700 |
| 5,295,043 | 3/1994 | Beijer | 361/704 |
| 5,329,426 | 7/1994 | Villani | 257/719 |
| 5,339,214 | 8/1994 | Nelson | 174/15.2 |
| 5,375,652 | 12/1994 | Matsunaga et al. | 257/719 |
| 5,422,790 | 6/1995 | Chen | 257/719 |
| 5,483,098 | 1/1996 | Joiner, Jr. | 257/719 |
| 5,486,981 | 1/1996 | Blomquist | 257/719 |
| 5,504,652 | 4/1996 | Foster et al. | 257/719 |
| 5,588,483 | 12/1996 | Ishida | 361/687 |
| 5,598,320 | 1/1997 | Toedtman | 361/700 |

*Primary Examiner*—Leo P. Picard
*Assistant Examiner*—Boris L. Chervinsky
*Attorney, Agent, or Firm*—Martin Fruitman

[57] ABSTRACT

The apparatus is a heat sink for an integrated circuit chip which uses heat pipe cooling to remove the heat. The heat sink is a heat conductive structure such as a bowl which is associated with the integrated circuit socket, with the heat conductive structure held against the integrated circuit. A heat pipe is attached to the structure by using an extension from the heat conductive structure and wrapping the extension around a simple cylindrical heat pipe. One embodiment uses spring clips to attach the heat sink to the socket, and another version uses attachment screws through tabs which are formed from the material around a bowl shaped heat conductive structure.

8 Claims, 3 Drawing Sheets

INTEGRATED CIRCUIT HEAT SEAT

BACKGROUND OF THE INVENTION

This invention relates generally to active solid state devices, and more specifically to the socket of an integrated circuit chip with a heat sink which uses a heat pipe and has the heat dissipator pressed against the integrated circuit.

With the advent of portable, battery operated, personal computers the cooling of integrated circuit chips has become both more critical and more difficult. Desk top computers which are connected to electrical power lines have comparatively unlimited space and power to locate and operate fans for cooling, and they also do not have severe weight restrictions. However, the fans within desk top computers generate significant undesirable audible noise.

Portable computers, the so called lap top computers, while generating little audible noise, are, however, very restricted in space, power, and weight, and such restrictions create significant problems in cooling the critical integrated circuits and disposing of the generated heat. At the same time, the number of functions and the power dissipated by individual integrated circuits has significantly increased, so that the problems involved in removing heat have also increased. Numerous patents have addressed these problems, but most of the devices are very complex and difficult to manufacture so that there are significant possibilities for improvement. Some of the prior art devices use heat sinks which are massive parts and which are impractical to use in a lap top computer. Others make no effort to move the heat away from a heat sink which is adjacent to the integrated circuit chip. Furthermore, no significant progress has been made in eliminating the noise generated by the fans. With the high powers now prevalent in computers, heat which is not removed can build up adjacent to the integrated circuit and can lead to high temperatures and damage to the integrated circuit chip.

SUMMARY OF THE INVENTION

The present invention is an inexpensive cooling apparatus for integrated circuit chips which is of simple, light weight construction. It is easily manufactured, requires little additional space and, while using no fan, provides an efficient method of cooling the integrated circuit and moving the heat away from the integrated circuit chip to a location from which the heat can be more easily disposed of.

The cooling apparatus of the present invention is constructed for use with an integrated circuit chip which is mounted on a conventional circuit board with a conventional socket. It requires no significant modification of the circuit board or socket because it is clamped against and has intimate contact with the integrated circuit chip by penetrating through an opening in the socket cover. Furthermore, the invention uses a very minimum number of simple parts.

The typical integrated circuit is mounted on a circuit board by being compressed between the circuit board and a socket, socket cover, or heat sink. The cover is designed to put pressure on the integrated circuit both to hold it against the electrical contact surfaces on the circuit board and to provide thermal contact between the integrated circuit and the cover or heat sink so that heat is efficiently transferred from the integrated circuit. Such an arrangement serves the same purpose whether the electrical contacts for the integrated circuit are located conventionally on the circuit board, or the integrated circuit is mounted upside down, and the electrical contacts are mounted in the socket cover itself.

The present invention is a heat sink which is separate from the socket cover but mates with the socket cover and is constructed to make direct thermal contact with the integrated circuit and to move the heat from the integrated circuit chip to another part of the equipment where it can be easily dissipated.

The heat sink of the preferred embodiment of the invention is constructed of thermally conductive sheet material, such as copper, and is formed with a central pedestal or square bowl-like structure with the outer periphery of the heat sink having extensions. In fact, except for the square configuration, the shape of the preferred embodiment of the heat sink is reminiscent of the classic dog bowl with a depression in the center, flat horizontal lip surfaces around the depression, and side skirts protruding in the same direction as the depression to prevent the bowl from tipping.

However, the depressed center portion of the heat sink is made flat so that it makes good thermal contact with the integrated circuit, and the lip surfaces around the depressed center portion include several holes which mate with upright spring clips installed on the socket cover. It is the spring clips which provide the force to hold the heat sink down tightly against the integrated circuit. An alternate embodiment uses corner tabs which are held down on the circuit board with screws.

Furthermore, the extensions of the heat sink are not always bent straight down in the same direction as the center depression. The edge of at least one of the extensions is wrapped back upon itself, and this wrapped section is fitted tightly around a simple cylindrical heat pipe. The heat generated by the integrated circuit is therefore conducted to the central bowl portion and then through the sides of the bowl and the surrounding lip portions of the heat sink to the heat pipe. The heat pipe can then very efficiently transfer the heat to any appropriate location, such as the computer case surfaces, for dissipation to the surrounding environment.

An alternate embodiment of the invention has a simple central portion which is a flat sheet located in the same plane as the lip portions, with a heat conductive pedestal in thermal contact with and extending below the central portion and into contact with the integrated circuit.

The structure of the invention is particularly versatile because any one or any number of the four extensions of the heat sink can be used to connect to heat pipes. Such a structure makes it possible to dispose of more heat as a design is upgraded, while still using the same integrated circuit socket and socket cover, and essentially the same heat sink, merely by adding more heat pipes. Furthermore, the direction of the wrap of the wrapped portion of the heat sink, that is, whether it is wrapped away from the integrated circuit or toward it, and whether the extension itself is bent up or down, can easily be changed during manufacture of the heat sink if such changes are advantageous for a particular equipment geometry.

The present invention therefore provides a heat sink which is thermally effective, simple to use, and inexpensive to manufacture.

DETAILED DESCRIPTION OF THE INVENTION

Figure 1:
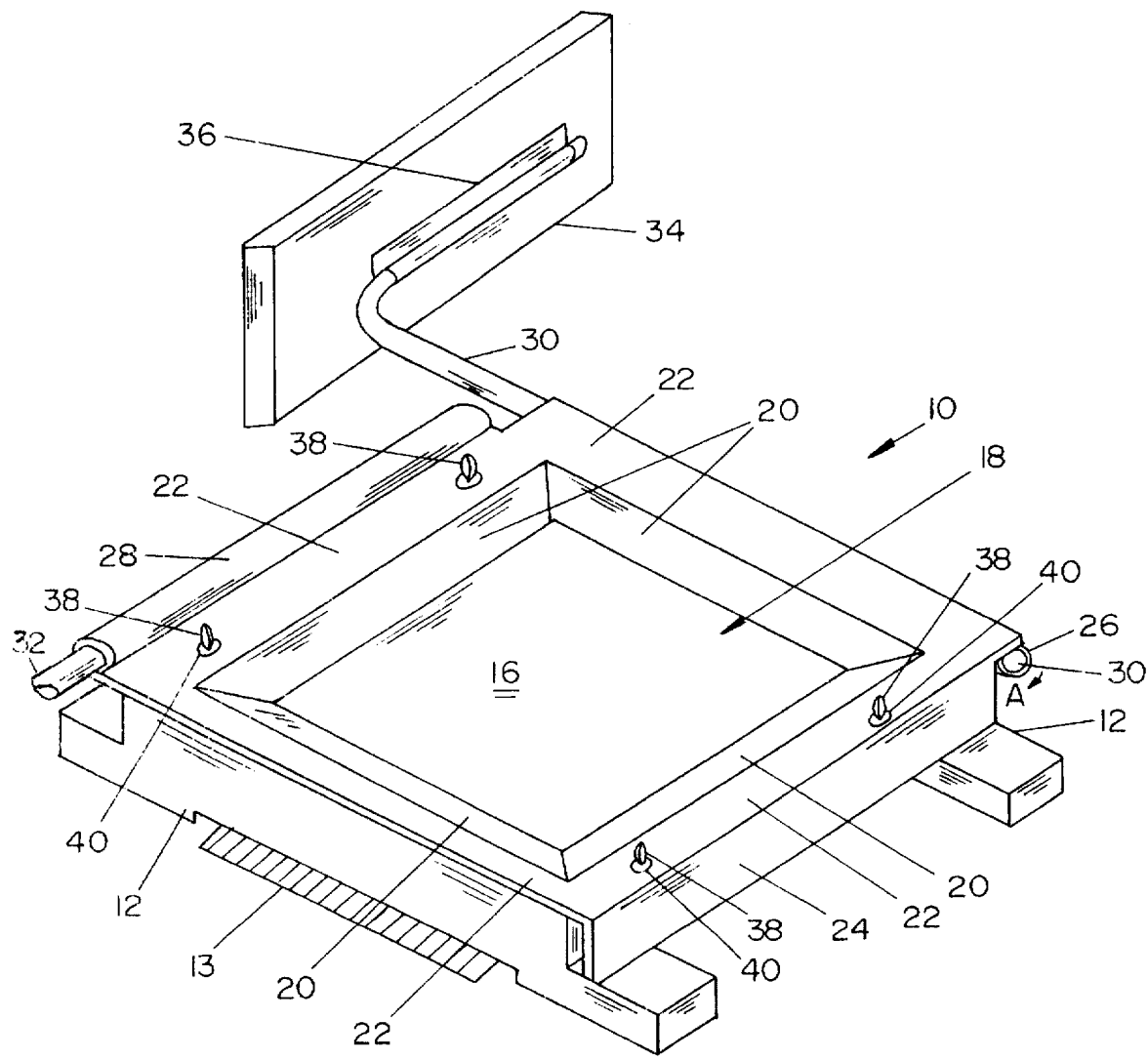
FIG. 1 is a perspective view of the preferred embodiment of the heat sink of the invention, shown installed upon a typical integrated circuit socket.

FIG. 1 is a perspective view of the preferred embodiment of heat sink 10 of the invention, shown installed upon a typical integrated circuit socket 12 which includes electrical connectors 13. Integrated circuit socket 12 encloses integrated circuit casing 14, which can only be seen in FIG. 2 and is located directly below central region 16 of bowl 18.

Heat sink 10 is constructed as a bowl 18 formed within a sheet of conductive material such as copper, and the remaining portions of the sheet around depressed central region 16 and sides 20 of bowl 18 are formed into lip portions 22 and extension portions 24, 26 and 28.

A critical aspect of heat sink 10 is that central region 16 of bowl 18 must be in intimate thermal contact with integrated circuit 14 which is between heat sink 10 and socket 12. Because of that requirement, the underside of central region 16 must be constructed as a flat surface to match the mating surface of integrated circuit 14.

The extension portions of heat sink 10 can be bent in the direction of socket 12 to form a skirt for support, as shown by extension portion 24, or, as can be seen above electrical connectors 13 in FIG. 1, an extension portion can also be completely removed for access to socket 12. However, the most important function of the extension portions of heat sink 10 is to serve as attachments to heat pipes 30 and 32. To accomplish this, extension portions 26 and 28 are wrapped back upon themselves and heat pipes 30 and 32 are inserted into those wrapped portions.

Heat pipe 30 is shown in FIG. 1 in a typical arrangement in which the heat pipe extends to another portion of the computer, for instance case wall 34, a portion of which is shown in FIG. 1. Typically, heat pipe 30 is attached to wall 34 by a heat conductive bonding material 36, so that the heat from integrated circuit 14 is transferred through central region 16, bowl sides 20, lip portions 22, and extension portion 26 to heat pipe 30. Heat pipe 30 then transports the heat to wall 34 from which it is dissipated into the surrounding environment.

As can be seen in FIG. 1 from the distinction between extension portions 26 and 28, the heat pipes can be located on either side of the plane of lip portions 22 simply by wrapping portions 26 and 28 in opposite directions.

In the preferred embodiment of FIG. 1, heat sink 10 is shown being held in contact with the integrated circuit by spring clips 38, which are attached to socket 12. Spring clips 38 of socket 12 fit through holes 40 in heat sink 10 and exert pressure to clamp the integrated circuit between socket 12 and heat sink 10.

One advantage of the heat sink configuration shown in FIG. 1 is the convenient accessibility to the integrated circuit. When, as is the usual situation, only one heat pipe such as heat pipe 30 is used with a socket, it is possible to lift heat sink 10 from over socket 12 and the integrated circuit simply by pulling heat sink 10 off of spring clips 38 and pivoting heat sink 10 around heat pipe 30 in direction A. This feature permits access to the integrated circuit if necessary, and afterwards heat sink 10 is simply rotated back into its original position atop the integrated circuit and snapped back over spring clips 38.

Figure 2:
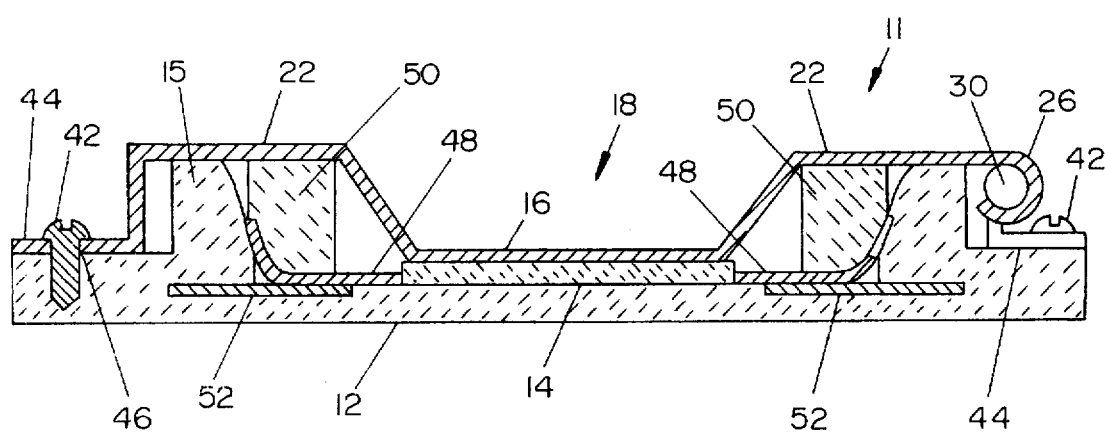
FIG. 2 is a cross section view of an alternate embodiment of the invention in which the heat sink is held in place by screws.

FIG. 2 is a cross section view of an alternate embodiment of the invention in which the only significant difference from FIG. 1 is that heat sink 11 is held in place by screws 42 rather than spring clips 38. Heat sink 11 is constructed so that the corners of the metal blank from which the extension portions are made are formed into bent tabs 44 with holes 46. FIG. 2 shows only two tabs 44 and two screws 42 which are on opposite corners of heat sink 11, but such tabs and screws can be used on any or all of the four corners of heat sink 11. Thus in FIG. 2 integrated circuit 14 is held between socket 1.2 and central portion 16 of heat sink 11 because screws 42 penetrate into holes 46 in socket 12.

FIG. 2 also depicts a typical arrangement for an integrated circuit socket 12 in which integrated circuit electrical leads 48 are captured between a portion 15 of socket 12 and socket cover 50 so that electrical leads 48 are held in contact with electrical conductors 52 of socket 12.

Figure 3:
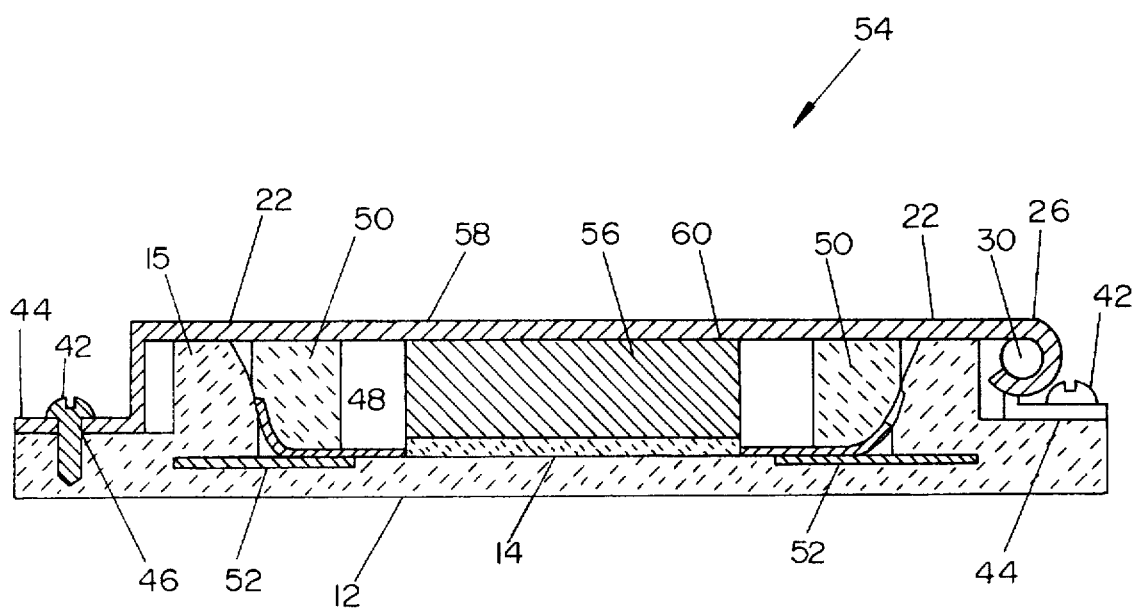
FIG. 3 is a cross section view of an alternate embodiment of the invention similar to FIG. 2 except the bowl is replaced with a heat conductive pedestal.

FIG. 3 is a cross section view of an alternate embodiment of a heat sink 54 of the invention in which bowl 18 of FIG. 2 is replaced by heat conductive pedestal 56 which is in thermal contact with central portion 58 of heat sink 54. In such an embodiment central portion 58 can be formed in the same plane as lip portions 22, and pedestal 56 can either be held in place by the force of central portion 58 pressing upon it, or pedestal 56 can be bonded to central portion 58 at contact surface 60.

As can be appreciated from the simplicity of the embodiments described above, the invention is quite simple to manufacture by conventional metal stamping techniques. Nevertheless, this simple structure furnishes superior removal of heat from the integrated circuit, along with very convenient installation of both the heat sink and the integrated circuit.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, other means for holding heat sink 10 upon integrated circuit 14 can be used, and the invention can be used on sockets of different configurations. Furthermore, central section 16 of bowl 18 need not be square.

What is claimed as new and for which Letters Patent of the United States are desired to be secured is:

1. A heat sink for an integrated circuit comprising:
   a heat conductive structure which is thermally interconnected with an integrated circuit through a heat conductive path;
   at least one extension of heat conductive material attached to the heat conductive structure, with the extension comprising a planar structure having at least one boundary edge wrapped back upon the extension to form a wrapped portion; and
   a heat pipe located within and in thermal contact with the wrapped portion so that a continuous heat transfer path is formed between the integrated circuit and the heat pipe.

2. The heat sink of claim 1 where in the heat conductive path between the heat conductive structure and the integrated circuit is a thermally conductive pedestal.

3. A heat sink for an integrated circuit comprising:
   a flat surface constructed of heat conductive material and held in contact with an integrated circuit;
   sides of heat conductive material attached to the flat surface and oriented at an angle to the flat surface to form a bowl structure;
   lip portions of heat conductive material attached to the sides on the ends of the sides remote from the flat surface;

an extension of heat conductive material attached to at least one lip portion, with the extension having at least one edge wrapped back upon the extension to form a wrapped portion; and a heat pipe located within and in thermal contact with the wrapped portion so that a continuous heat transfer path is formed between the flat surface and the heat pipe.

4. The heat sink of claim 3 further including a heat dissipating structure thermally interconnected with the heat pipe so that the heat pipe moves the heat from the integrated circuit to the heat dissipating structure.

5. The heat sink of claim 3 further including holes in the lip portions of the heat sink, spring clips attached to an integrated circuit socket and protruding through the holes and holding the heat sink flat surface against the integrated circuit.

6. The heat sink of claim 3 further including tabs with holes attached to the heat sink, and screws through the holes in the tabs and into the socket to hold the heat sink flat surface against the integrated circuit.

7. The heat sink of claim 3 wherein the wrapped portion is located on the opposite side of the plane of the lip portion from the flat surface.

8. The heat sink of claim 3 wherein the wrapped portion is located on the same side of the plane of the lip portion as the flat surface.

* * * * *